(12) United States Patent
Hong et al.

(10) Patent No.: US 8,541,254 B2
(45) Date of Patent: Sep. 24, 2013

(54) SOLAR CELL MODULE AND METHOD FOR MANUFACTURING THE SAME

(75) Inventors: Jongkyoung Hong, Seoul (KR); Jemin Yu, Seoul (KR); Taeyoon Kim, Seoul (KR); Eunjoo Lee, Seoul (KR); Seiyoung Mun, Seoul (KR); Youngho Choe, Seoul (KR); Taeki Woo, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/252,739

(22) Filed: Oct. 4, 2011

(65) Prior Publication Data

US 2012/0282725 A1    Nov. 8, 2012

Related U.S. Application Data

(62) Division of application No. 13/221,110, filed on Aug. 30, 2011.

(30) Foreign Application Priority Data

May 4, 2011    (KR) .................. 10-2011-0042284

(51) Int. Cl.
*H01L 21/00*    (2006.01)
(52) U.S. Cl.
USPC ............................................. 438/57; 136/251

(58) Field of Classification Search
USPC .................... 438/51, 55, 57, 64; 136/251
See application file for complete search history.

(56) References Cited

U.S. PATENT DOCUMENTS

| 6,005,184 A * | 12/1999 | Barnes .......................... 136/246 |
| 2008/0276983 A1 | 11/2008 | Drake et al. |
| 2009/0101204 A1 * | 4/2009 | Levy et al. ..................... 136/256 |
| 2009/0145478 A1 * | 6/2009 | Takahashi ..................... 136/256 |

FOREIGN PATENT DOCUMENTS

| WO | WO 2010/051355 A2 | 5/2010 |
| WO | WO 2010051355 A2 * | 5/2010 |
| WO | WO 2010/141697 A2 | 12/2010 |

* cited by examiner

*Primary Examiner* — Brook Kebede
(74) *Attorney, Agent, or Firm* — Birch, Stewart, Kolasch & Birch, LLP

(57) ABSTRACT

A solar cell module and a method for manufacturing the same are discussed. The method for manufacturing a solar cell module includes forming a front protective member including a hardened first silicone resin on a first surface of a front substrate; disposing a plurality of solar cells on the front protective member; forming a back protective member including a hardened second silicone resin and a fiber material on the plurality of solar cells; and disposing a back substrate on the fiber material.

16 Claims, 7 Drawing Sheets

SOLAR CELL MODULE AND METHOD FOR MANUFACTURING THE SAME

This application is a Divisional of copending application Ser. No. 13/221,110 filed on Aug. 30, 2011, which claims priority to and the benefit of Korean Patent Application No. 10-2011-0042284 filed in the Korean Intellectual Property Office on May 4, 2011, the entire contents of which are incorporated herein by reference.

BACKGROUND OF THE INVENTION

1. Field of the Invention

Embodiments of the invention relate to a solar cell module and a method for manufacturing the same.

2. Description of the Related Art

Solar power generation to convert light energy into electric energy using a photoelectric conversion effect has been widely used as a method for obtaining eco-friendly energy. A solar power generation system using a plurality of solar cell modules has been installed in places, such as houses due to an improvement in a photoelectric conversion efficiency of solar cells.

The solar cell module includes a plurality of solar cells, each of which generates electric current by solar light, and protective members, which are disposed on upper parts and lower parts of the solar cells to protect the solar cells from an external environment such as an external impact and moisture.

SUMMARY OF THE INVENTION

In one aspect, there is a solar cell module including a plurality of solar cells, a front substrate positioned at first surfaces of the plurality of solar cells, a back substrate positioned at second surfaces of the plurality of solar cells, a front protective member positioned between the front substrate and the plurality of solar cells, the front protective member including a first silicone resin, a back protective member positioned between the back substrate and the plurality of solar cells the back protective member including a second silicone resin, and a fiber material disposed between the first substrate and the back substrate.

A transmittance of the second silicone resin may be less than a transmittance of the first silicone resin. In other words, the transmittance of the first silicone resin may be greater than the transmittance of the second silicone resin. Further, an absorptance of the first silicone resin may be less than an absorptance of the second silicone resin at a short wavelength.

The first silicone resin may have a transmittance equal to or greater than about 70% at a wavelength of about 300 nm to 500 nm. The second silicone resin may have a transmittance less than about 70% at a wavelength of about 300 nm to 500 nm.

An adhesive strength between the first silicone resin and the front substrate may be greater than an adhesive strength between the first silicone resin and the solar cells. Further, an adhesive strength between the second silicone resin and the back substrate may be greater than an adhesive strength between the second silicone resin and the solar cells.

The second silicone resin may include an ultraviolet blocking material.

At least one of the first silicone resin, the second silicone resin, and the fiber material may include a dye.

The first silicone resin and the second silicone resin may have the same thickness. Alternatively, a thickness of the second silicone resin may be greater than a thickness of the first silicone resin.

The first silicone resin, the second silicone resin, and the fiber material may have a thickness of about 0.3 mm to 0.5 mm.

A thickness of the fiber material may be less than a thickness of the first silicone resin and a thickness of the second silicone resin.

The first silicone resin and the second silicone resin may be formed of the same material or different materials.

An interface between the first silicone resin and the second silicone resin may be an uneven surface.

The plurality of solar cells may be positioned on the first silicone resin, and a lateral part and an upper part of each of the plurality of solar cells may be covered by the second silicone resin.

At least a portion of each of the plurality of solar cells may be buried in the first silicone resin, and a remaining portion except the buried portion of each solar cell may be covered by the second silicone resin.

The interconnector positioned at the first surfaces of the plurality of solar cells may be buried in the first silicone resin, instead of burying at least a portion of each solar cell in the first silicone resin.

One surface of the fiber material may contact the back substrate. Alternatively, at least a portion of one surface of the fiber material may be separated from the back substrate. A space between the fiber material and the back substrate may be filled with the second silicone resin.

The fiber material may be positioned closer to the back substrate than the solar cells. An amount of light incident on the fiber material when the fiber material is positioned closer to the back substrate than the solar cells is more than an amount of light incident on the fiber material when the fiber material is positioned closer to the solar cells than the back substrate. Therefore, the reflection effect of the fiber material increases, and the efficiency of the solar cell module is improved.

The fiber material may have a mesh form and may be at least one of glass fiber, quartz fiber, graphite fiber, nylon fiber, polyester fiber, aramid fiber, polyethylene fiber, polypropylene fiber, and silicon carbide fiber.

A space between individual fibers of the fiber material may be filled with the second silicone resin.

Each of the first silicone resin and the second silicone resin may include a curing agent of about 50 parts by weight.

In another aspect, there is a method for manufacturing a solar cell module including coating a liquid first silicone resin on one surface of a front substrate, hardening the first silicone resin, disposing a plurality of solar cells on the hardened first silicone resin, coating a liquid second silicone resin on the plurality of solar cells, disposing a fiber material on the second silicone resin, disposing a back substrate on the fiber material, and hardening the second silicone resin.

The first silicone resin and the second silicone resin may be hardened at a temperature equal to or higher than about 80° C., for example, at about 90° C. to 110° C.

When the liquid first and second silicone resins are used, the first and second silicone resins may overflow outside the front substrate. Thus, a frame surrounding the front substrate may be used, so as to prevent the first and second silicone resins from overflowing outside the front substrate.

When the frame is used, the first and second silicone resins may be hardened in an oven. When the frame is not used, the first silicone resin may be hardened using the oven, and he second silicone resin may be hardened using a laminating device.

According to the above-described characteristics, the transmittances of the first and second silicone resins constituting the front protective member and the back protective member are greater than a transmittance of an existing protective member formed of ethylene vinyl acetate (EVA) or polyvinyl butyral (PVB) at a short wavelength, for example, an ultraviolet band. Thus, the decoloration of the first and second silicone resins resulting from an exposure to ultraviolet light may be prevented, and an amount of light incident on the solar cells may increase. As a result, the output of the solar cell module may be improved.

Because the first silicone resin may be manufactured to be thinner than EVA used in the existing protective layer, the thickness of the solar cell module may be reduced.

Further, the adhesive strengths between the silicone resin and the front substrate and the back substrate are more excellent than the adhesive strength between the silicone resin and the solar cells. For example, when the front substrate and the back substrate are formed of glass, the adhesive strengths between the silicone resin and the front substrate and the back substrate are approximately 10 kg/cm$^2$ to 15 kg/cm$^2$. Further, the adhesive strength between the silicone resin and the solar cells is approximately 3 kg/cm$^2$ to 10 kg/cm$^2$.

As above, because the adhesive strengths between the silicone resin and the substrates are excellent, the embodiment of the invention may prevent the penetration of moisture, oxygen, and impurities more efficiently than the existing protective member for a long time. Thus, the reliability of the solar cell module may be improved.

Because the first silicone resin positioned at the first surfaces of the solar cells is formed a material having the transmittance greater than the second silicone resin and the second silicone resin positioned at the second surfaces of the solar cells is formed a material having the transmittance less than the first silicone resin, an amount of light incident on the solar cells may increase, and the back substrate, for example, a back sheet may be prevented from being discolored and degraded.

Further, because the second silicone resin includes the ultraviolet blocking material, the discoloration and the degradation of the back sheet may be prevented more efficiently.

Because at least one of the first silicone resin, the second silicone resin, and the fiber material includes the dye, an appearance of the solar cell module may be improved.

Because at least a portion of each solar cell is buried in the first silicone resin, a location of the solar cells may be fixed by the first silicone resin. Thus, misarrangement of the solar cells may be prevented in subsequent module processing.

Because the interface between the first silicone resin and the second silicone resin is the uneven surface, light incident through the front substrate may be diffusely reflected from the interface. Hence, an amount of light incident on the solar cells may increase and the output of the solar cell module may be improved.

Because the fiber material is positioned between the back substrate and the solar cells, the strength of the solar cell module increases and a crack of the solar cell module is prevented by the fiber material. Further, because the twisting of the solar cells is prevented in a laminating process, the leveling of the back substrate is excellently implemented.

The second silicone resin is filled in the space between the fibers of the fiber material having the mesh form. Alternatively, when at least a portion of the fiber material is separated from the back substrate, the second silicone resin is filled in a space between the fiber material and the back substrate. Thus, the components of the solar cell module may be easily attached to one another.

The fiber material may be positioned closer to the back substrate than the solar cells. The reflection effect when the fiber material is positioned closer to the back substrate than the solar cells is more excellent than the reflection effect when the fiber material is positioned closer to the solar cells than the back substrate. Thus, the efficiency of the solar cell module may be improved. Further, when the second silicone resin is manufactured to be thicker than the first silicone resin, the weatherproof of the solar cell module may be improved.

Further, because the first and second silicone resins are hardened at a lower temperature than the existing protective member, the module processing may be performed at a lower temperature and curing time may be reduced.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
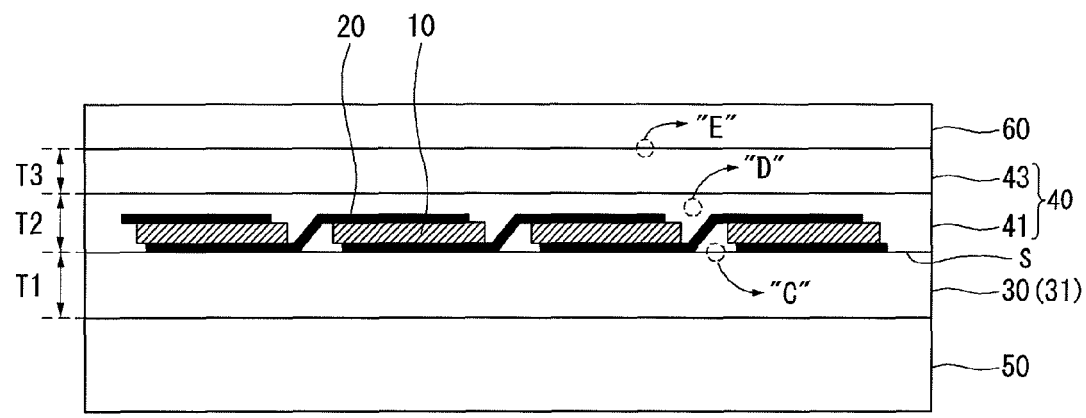
FIG. 1 is a conceptual diagram illustrating a schematic configuration of a solar cell module according to a first embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

A solar cell module according to an example embodiment of the invention is described in detail with reference to the accompanying drawings.

FIG. 1 is a conceptual diagram illustrating a schematic configuration of a solar cell module according to a first embodiment of the invention.

As shown in FIG. 1, a solar cell module according to a first embodiment of the invention includes a plurality of solar cells 10, interconnectors 20 for electrically connecting the plurality of solar cells 10 to one another, a front protective member 30 and a back protective member 40 for protecting the plurality of solar cells 10, a front substrate 50 positioned on front surfaces of the plurality of solar cells 10, and a back substrate 60 positioned on back surfaces of the plurality of solar cells 10. In embodiments of the invention, the front substrate 50 may be one having a light transmission property.

The front substrate 50 is positioned at first surfaces (for example, light receiving surfaces) of the solar cells 10 and is formed, for example, of a tempered glass having a high transmittance. The tempered glass may be a low iron tempered glass containing a small amount of iron. The front substrate 50 may have an embossed inner surface so as to increase a scattering effect of light.

The front protective member 30 and the back protective member 40 prevent corrosion of metal resulting from penetration of moisture and protect the solar cells 10 from an impact.

The front protective member 30 has a transmittance equal to or greater than about 70% at a short wavelength, for example, at a wavelength of about 300 nm to 500 nm. The front protective member 30 is formed of a first silicone resin 31, in which an adhesive strength between the first silicone resin 31 and the front substrate 50 is about 10 kg/cm$^2$ to 15 kg/cm$^2$. The front protective member 30 may be formed by coating and curing the first silicone resin 31 of a liquid state. The first silicone resin 31 may be formed of siloxane such as polydimethylsiloxane (PDMS) and polydialkylsiloxane (PDAS).

Absorption coefficients of the first silicone resin 31 and ethylene vinyl acetate (EVA) based on a wavelength of light is described below with reference to FIG. 2.

Figure 2:
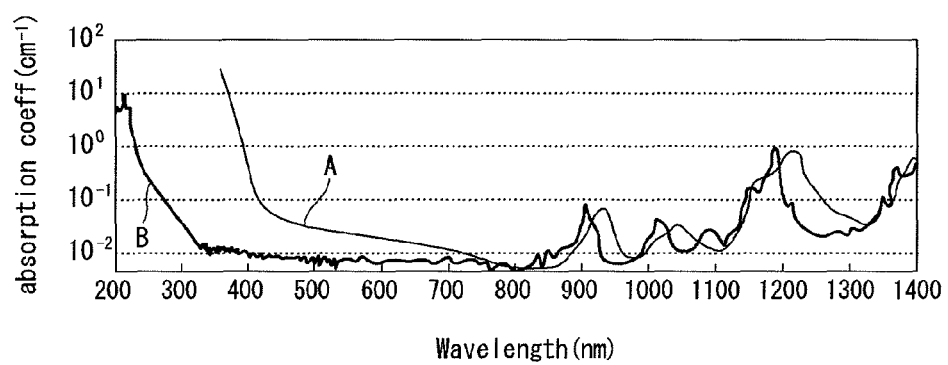
FIG. 2 is a graph illustrating absorption coefficients of a silicone resin and ethylene vinyl acetate (EVA) based on a wavelength of light.

In the graph shown in FIG. 2, a graph "A" indicates changes in an absorption coefficient of EVA based on the wavelength of light, and a graph "B" indicates changes in an absorption coefficient of the first silicone resin 31 based on the wavelength of light.

EVA used in the graph "A" is a product generally used as a protective member of a solar cell, and the first silicone resin 31 used in the graph "B" is PDMS in this embodiment of the invention.

As shown in FIG. 2, the absorption coefficient of EVA is greater than the absorption coefficient of PDMS at the short wavelength, for example, at the wavelength of about 300 nm to 700 nm with a marked difference at the wavelength of about 300 nm to 500 nm. Thus, the absorption coefficient of EVA is greater than the absorption coefficient of the first silicone resin 31 at the short wavelength.

The low absorption coefficient of the first silicon resin 31 at the short wavelength indicates that light of the short wavelength is sufficiently transmitted. According to FIG. 2, the first silicone resin 31, more specifically, siloxane such as PDMS and PDAS had a transmittance equal to or greater than about 70% at the short wavelength. Thus, when the first silicone resin 31 is used as the front protective member 30, an amount of light absorbed in the front protective member 30 decreases. As a result, an amount of light incident on the solar cells 10 increases. Hence, output efficiency of the solar cell module is improved.

Further, the first silicone resin 31 may prevent or reduce the decoloration or discoloration of the front protective member 30 resulting from an exposure to ultraviolet light and the corrosion of the front protective member 30 resulting from the absorption of air and oxygen. Hence, the durability of the solar cell module is improved.

Further, because the first silicone resin 31 may be manufactured to be thinner than EVA used in an existing or convention protective layer, a thickness of the solar cell module may be reduced. For example, a thickness of the protective layer formed of EVA may be about 1.0 mm, and a thickness T1 of the first silicone resin 31 may be equal to or less than about 0.7 mm, preferably, but not necessarily, about 0.3 mm to 0.5 mm. Hence, the entire thickness of the solar cell module may be reduced.

Further, because a curing temperature of the first silicone resin 31 is lower than a curing temperature of EVA, module processing may be performed at a lower temperature and curing time may be reduced. For example, the first silicone resin 31 may be toughened (e.g., cured) at a temperature equal to or higher than about 80° C., for example, at a temperature of 90° C. to 110° C., and EVA may be cured at about 165° C. Thus, the module processing may be performed at a lower temperature. Further, it takes about 1.5 minutes to cure the first silicone resin 31, and it takes about 16 minutes to cure EVA. Thus, time required in the curing processing of the protective layer and the module processing may be reduced.

The first silicone resin 31 may include a curing agent of about 50 parts by weight.

The back protective member 40 is formed of a fiber enhanced (or reinforced) silicone resin thin film including a second silicone resin 41 and a fiber material 43. A transmittance of the second silicone resin 41 is less than the transmittance of the first silicone resin 31 at the short wavelength and may be formed of a resin, in which an adhesive strength between the second silicone resin 41 and the back substrate 60 is about 10 kg/cm$^2$ to 15 kg/cm$^2$.

A thickness T2 of the second silicone resin 41 may be about 0.3 mm to 0.5 mm and may be substantially equal to the thickness T1 of the first silicone resin 31. Alternatively, the thickness T2 of the second silicone resin 41 may be greater than the thickness T1 of the first silicone resin 31, so as to improve weatherproofing of the solar cell module.

Because the transmittance of the second silicone resin 41 is less than the transmittance of the first silicone resin 31, a portion of light of the short wavelength transmitted by the first silicone resin 31 is not transmitted by the second silicone resin 41. Thus, the back substrate 60, for example, a back sheet may be prevented or reduced from being discolored and degraded by the light of the short wavelength transmitted by the second silicone resin 41.

Figure 3:
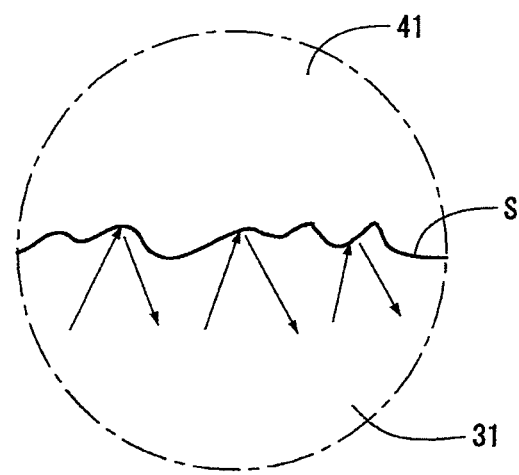
FIG. 3 is an enlarged view of a portion "C" of FIG. 1.

An interface S between the first silicone resin 31 and the second silicone resin 41 is an uneven surface as shown in FIG. 3. The uneven surface is a non-flat surface having uneven portions.

As above, a reason to form the interface S as the uneven surface is that the coated liquid first silicone resin 31 is toughened (e.g., cured) at a setting temperature and then the second silicone resin 41 is formed on the first silicone resin 31.

Because the interface S between the first silicone resin 31 and the second silicone resin 41 is the uneven surface, the light transmitted by the first silicone resin 31 is diffusely reflected from the interface S as indicated by an arrow of FIG. 3. Thus, an amount of light retained in the solar cells 10 increases.

As shown in FIG. 1, the solar cells 10 are positioned on the first silicone resin 31, i.e., on the interface S between the first silicone resin 31 and the second silicone resin 41. Thus, a lateral part and an upper part of each of the solar cells 10 are covered by the second silicone resin 41.

Figure 4:
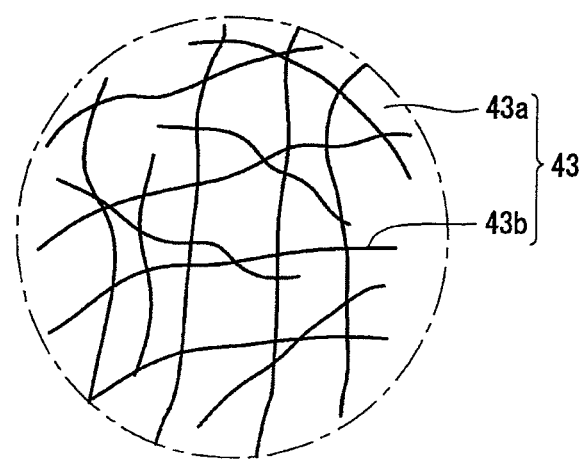
FIG. 4 is an enlarged view of a portion "D" of FIG. 1.

As shown in FIG. 4, the fiber material 43 includes individual fibers 43b divided by a space 43a. Thus, the fiber material 43 is formed in a mesh form. In embodiments of the invention, the mesh form of the fiber material 43 may be regular or irregular. When regular, the mesh form may be a matrix form, and the opening in the mesh may be polygon form, circular form or other shapes. When irregular, the mesh form may be a collection of random forms, some of which may be regular mesh forms. In embodiments of the invention, the fiber material 43 may be formed by the individual fibers 43b being cross-linked, tangled or woven.

The fiber material 43 having the above-described configuration may be positioned closer to the back substrate 60 than the solar cells 10. For example, as shown in FIG. 1, the fiber material 43 contacts the back substrate 60.

Because the fiber material 43 is formed in the mesh form, the space 43a of the fiber material 43 is filled with the second silicone resin 41. However, the second silicone resin 41 filled in the space 43a is omitted in FIG. 4, so as to clearly show the space 43a.

Figure 5:
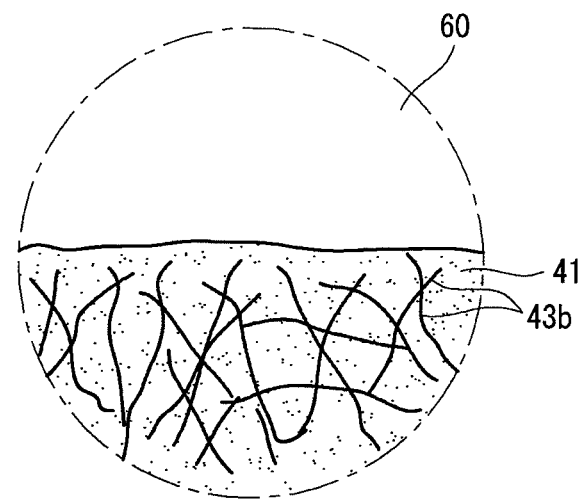
FIG. 5 is an enlarged view of a portion "E" of FIG. 1.

Shown in FIG. 5 is an enlarged view of a portion "E" of FIG. 1, in which at least a portion of the fiber material 43 is separated from the back substrate 60. In this instance, the second silicone resin 41 is filled in a space between the fiber material 43 and the back substrate 60 as well as the space 43a of the fiber material 43 containing the individual fibers 43a.

Thus, when at least a portion of the fiber material 43 is separated from the back substrate 60 or the entire portion of the fiber material 43 completely contacts the back substrate 60, the second silicone resin 41 is attached to the back substrate 60.

The fiber material 43 may be formed of a glass fiber. For example, the fiber material 43 may be Style 106 glass fiber of standard size of 8×8 inches (i.e., about 20.32×20.32 cm) manufactured by BGF Industries Inc. Other materials may be used for the fiber material 43.

For example, the fiber material 43 may be any material including the individual fibers 43b having a high Young's modulus (for example, 3 GPa or more at 25° C.) and a high tensile strength (for example, 50 MPa or more at 25° C.).

Examples of the fiber material 43 include a glass fiber containing stiffening agent, quartz fiber, graphite fiber, nylon fiber, polyester fiber, aramid fiber such as Kevlar® and Nomex®, polyethylene fiber, polypropylene fiber, and silicon carbide fiber, or a combination thereof. Other fibers, or materials formed into fibers may be used.

The thickness T3 of the fiber material 43 may be about 0.3 mm to 0.5 mm. A thickness T3 of the fiber material 43 is less than the thickness T1 of the first silicone resin 31 and the thickness T2 of the second silicone resin 41, respectively, in the range of 0.3 mm to 0.5 mm.

When the fiber material 43 having the above-described configuration is disposed between the solar cells 10 and the back substrate 60, the strength of the solar cell module increases and a crack of the solar cell module is prevented or reduce due to the fiber material 43. Further, because the twisting of the second silicone resin 41 is prevented or reduced in a process for curing the second silicone resin 41, the leveling of the back substrate 60 is improved.

Further, because light, which is not absorbed in the solar cells 10, is reflected by the fiber material 43, the efficiency of the solar cell module is improved due to a reflection effect of the fiber material 43. An amount of light incident on the fiber material 43 when the fiber material 43 is positioned closer to the back substrate 60 than the solar cells 10 is more than an amount of light incident on the fiber material 43 when the fiber material 43 is positioned closer to the solar cells 10 than the back substrate 60. Therefore, the reflection effect of the fiber material 43 increases, and the efficiency of the solar cell module is improved.

The back substrate 60 may be a substrate formed of a transmission material or a back sheet formed of a non-transmission material based on a kind or a structure of the solar cells 10 of the solar cell module.

An example of a solar cell usable in the solar cell module according to the embodiment of the invention is described below with reference to FIG. 6. The embodiment of the invention may use other types of solar cells as well as the solar cell shown in FIG. 6.

Figure 6:
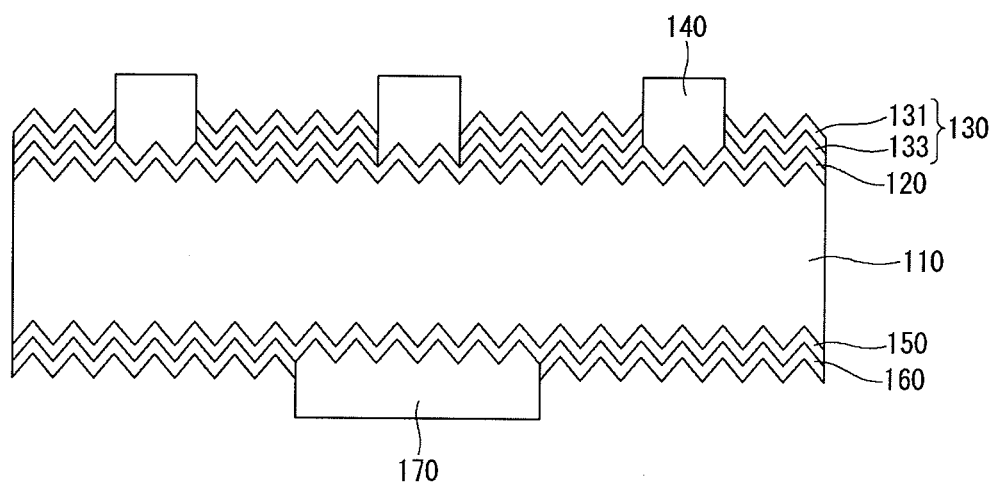
FIG. 6 is a cross-sectional view illustrating a schematic configuration of a solar cell used in a solar cell module according to an example embodiment of the invention.

As shown in FIG. 6, the solar cell 10 includes a substrate 110, an emitter layer 120 positioned at one surface, for example, a front surface of the substrate 110, a first anti-reflection layer 130 positioned on the emitter layer 120, a plurality of first electrodes 140 positioned on the emitter layer 120 on which the first anti-reflection layer 130 is not positioned, a back surface field (BSF) layer 150 positioned at a back surface of the substrate 110, a second anti-reflection layer 160 positioned on a back surface of the back surface field layer 150, and a plurality of second electrodes 170 positioned on the back surface of the back surface field layer 150 on which the second anti-reflection layer 160 is not positioned.

The substrate 110 may be formed of a silicon wafer of a first conductive type, for example, n-type, though not required. Silicon used in the substrate 110 may be crystalline silicon, such as single crystal silicon or polycrystalline silicon, or may be amorphous silicon. When the substrate 110 is of the n-type, the substrate 110 may contain impurities of a group V element such as phosphorus (P), arsenic (As), and antimony (Sb). The substrate 110 may have resistivity of about 1 $\Omega \cdot cm^2$ to 10 $\Omega \cdot cm^2$.

Alternatively, the substrate 110 may be of a p-type and/or be formed of other semiconductor materials other than silicon. When the substrate 110 is of the p-type, the substrate 110 may contain impurities of a group III element such as boron (B), gallium (Ga), and indium (In).

At least one of the front surface and the back surface of the substrate 110 is uniformly textured to form a textured surface corresponding to an uneven surface or having uneven characteristics.

The emitter layer 120 positioned at the textured front surface of the substrate 110 is an impurity region of a second conductive type (for example, p-type) opposite the first conductive type (for example, n-type) of the substrate 110 and forms a p-n junction along with the substrate 110.

A plurality of electron-hole pairs produced by light incident on the substrate 110 are separated into electrons and holes by a built-in potential difference resulting from the p-n junction between the substrate 110 and the emitter layer 120. The separated electrons move to the n-type semiconductor, and the separated holes move to the p-type semiconductor. Thus, when the substrate 110 is of the n-type and the emitter layer 120 is of the p-type, the separated electrons and the separated holes move to the substrate 110 and the emitter layer 120, respectively. Hence, the electrons become major carriers in the substrate 110, and the holes become major carriers in the emitter layer 120.

When the emitter layer 120 is of the p-type, the emitter layer 120 may be formed by doping the substrate 110 with impurities of a group III element such as boron (B), gallium (Ga), and indium (In). The emitter layer 120 may have surface resistivity of about 30 Ω/sq to 120 Ω/sq.

Alternatively, when the substrate 110 is of the p-type, the emitter layer 120 may be of the n-type. In this instance, the separated holes move to the substrate 110, and the separated electrons move to the emitter layer 120. When the emitter layer 120 is of the n-type, the emitter layer 120 may be formed by doping the substrate 110 with impurities of a group V element such as phosphorus (P), arsenic (As), and antimony (Sb).

The first anti-reflection layer 130 positioned on the emitter layer 120 of the front surface of the substrate 110 may contain a metal oxide-based material. For example, the first anti-reflection layer 130 includes an upper layer 131 formed of silicon nitride (SiNx:H) and a lower layer 133 between the emitter layer 120 and the upper layer 131. The lower layer 133 may be formed of a material, for example, aluminum oxide (AlOx), in which there is a great difference between absorption coefficients or large bandgaps of the material and silicon nitride (SiNx:H). The lower layer 133 may be formed of silicon oxide (SiOx:H) instead of the aluminum oxide (AlOx).

The first anti-reflection layer 130 having above-described configuration serves as an anti-reflection layer, which reduces a reflectance of light incident through the front surface of the substrate 110 and increases selectivity of a predetermined wavelength band, and also serves as a passivation layer.

The first anti-reflection layer 130 includes a plurality of contact lines exposing a portion of the emitter layer 120. The first electrodes 140 are formed on the emitter layer 120 exposed through the contact lines.

The contact line may have a width of about 20 μm to 60 μm and may have a planar area corresponding to about 2% to 6% of a planar area of the emitter layer 120, so that the first electrode 140 has a narrow width and a high aspect ratio.

When the contact line has the width of about 20 μm to 60 μm, the first electrode 140 may be formed to have a thickness of about 20 μm to 50 μm using a plating process.

According to the above-described structure, the first electrode 140 has the high aspect ratio of about 0.83 to 1. In embodiments of the invention, aspect ratio or high aspect ratio refers to a ratio of width to height.

The first electrodes 140 formed on the emitter layer 120 exposed through the contact lines are electrically and physically connected to the emitter layer 120. The first electrodes 140 extend substantially parallel to one another in a fixed direction.

The first electrodes 140 collect carriers (for example, holes) moving to the emitter layer 120. In the example embodiment of the invention, the first electrodes 140 may be finger electrodes. Alternatively, each first electrode 140 may be a finger electrode current collector or both a finger electrode and a finger electrode current collector.

In the example embodiment of the invention, the first electrode 140 may be formed of a plating layer. The plating layer may include a metal seed layer, a diffusion barrier layer, and a conductive layer, that are sequentially formed on the emitter layer 120.

The metal seed layer may be formed of a material containing nickel, for example, nickel silicide (including $Ni_2Si$, NiSi, $NiSi_2$, etc.) and may have a thickness of about 50 nm to 200 nm.

When the thickness of the metal seed layer is less than about 50 nm, a high resistance is obtained and it is difficult to form a uniform metal seed layer. Thus, it is difficult to achieve uniformity in a subsequent process, i.e., in a plating process of the diffusion barrier layer. When the thickness of the metal seed layer is greater than about 200 nm, the metal seed layer is distributed into silicon at a constant rate in a thermal process to form a nickel silicide layer. Thus, a shunt leakage current may occur because of the distribution of nickel.

The diffusion barrier layer on the metal seed layer prevents junction degradation generated when a formation material of the conductive layer is diffused into a silicon interface through the metal seed layer. The diffusion barrier layer includes a nickel layer having a thickness of about 5 μm to 15 μm.

The conductive layer on the diffusion barrier layer is formed of at least one conductive metal material. Examples of the conductive metal material include at least one selected from the group consisting of nickel (Ni), copper (Cu), silver (Ag), aluminum (Al), tin (Sn), zinc (Zn), indium (In), titanium (Ti), gold (Au), and a combination thereof. Other materials may be used.

In the example embodiment of the invention, the conductive layer may include a copper layer. The copper layer substantially serves as an electrical wire and has a thickness of about 10 μm to 30 μm. However, it is known that copper easily oxidizes in the air. Also, it is difficult to directly solder an interconnector, for example, a ribbon for electrically connecting the adjacent solar cells to the copper layer in module processing. Thus, when the conductive layer includes the copper layer, the conductive layer may further include a tin layer that prevents oxidization of copper and is used to smoothly perform a soldering process of the ribbon. The tin layer may have a thickness of about 5 μm to 15 μm.

When the conductive layer includes a metal layer other than the copper layer, the tin layer may be omitted if the conductive layer does not easily oxidize in the air and is used to smoothly perform the soldering process of the ribbon.

When the first electrodes 140 are finger electrodes, a current collector for collecting carriers moving to the finger electrodes may be further formed on the front surface of the substrate 110. The current collector may be formed using a conductive electrode in the same manner as the first electrode 140. Also, the current collector may be formed by printing, drying, and firing a conductive paste containing a conductive material, in a manner unlike the first electrode 140.

The second electrodes 170 on the back surface of the substrate 110 collect carriers (for example, electrons) moving to the substrate 110 and output the carriers to an external device. In the example embodiment of the invention, the second electrodes 170 may be finger electrodes. Alternatively, each second electrode 170 may be a finger electrode current collector or both a finger electrode and a finger electrode current collector.

The second electrodes 170 may be formed of at least one conductive material selected from the group consisting of aluminum (Al), nickel (Ni), copper (Cu), silver (Ag), tin (Sn), zinc (Zn), indium (In), titanium (Ti), gold (Au), and a combination thereof. The second electrodes 170 are formed of a conductive paste including Ag particles or may be formed using a plating layer in the same manner as the first electrodes 140.

A width of the second electrode 170 may be equal to or greater than a width of the first electrode 140. When the width of the second electrode 170 is greater than the width of the first electrode 140, a line resistance of the second electrode 170 may be reduced.

The back surface field layer 150 electrically and physically connected to the second electrodes 170 is positioned at the entire back surface of the substrate 110. The back surface field layer 150 is a region (for example, $n^+$-type region) that is more heavily doped than the substrate 110 with impurities of the same conductive type as the substrate 110. The back surface field layer 150 may have surface resistivity of about 50 Ω/sq to 150 Ω/sq. In other embodiments, the back surface field layer 150 may be formed locally at the back of the substrate 110.

The movement of holes to the back surface of the substrate 110 may be prevented or reduced by a potential barrier resulting from a difference between impurity concentrations of the substrate 110 and the back surface field layer 150. Hence, a recombination and/or a disappearance of electrons and holes around the back surface of the substrate 110 may be prevented or reduced.

The second anti-reflection layer 160 is positioned on the back surface of the back surface field layer 150 on which the second electrodes 170 are not positioned. The second anti-reflection layer 160 may be formed of silicon nitride (SiNx: H), or other materials.

When light irradiated onto the solar cell is incident on the substrate 110 through the emitter layer 120 and/or the back surface field layer 150, a plurality of electron-hole pairs are generated in the substrate 110 by light energy produced based on the light incident on the substrate 110. Because the front surface and/or the back surface of the substrate 110 are the textured surfaces, a light reflectance in each of the front surface and the back surface of the substrate 110 is reduced. Further, because both a light incident operation and a light reflection operation are performed on the textured surfaces of the substrate 110, light is confined in the solar cell. Hence, absorption of light increases and the efficiency of the solar cell is improved. In addition, because a reflection loss of light incident on the substrate 110 is reduced by the first and second anti-reflection layers 130 and 160, a useable amount of light incident on the substrate 110 further increases.

The electron-hole pairs are separated into electrons and holes by the p-n junction between the substrate 110 and the emitter layer 120, and the separated holes move to the p-type emitter layer 120 and the separated electrons move to the n-type substrate 110. The holes moving to the emitter layer 120 move to the first electrodes 140, and the electrons moving to the substrate 110 move to the second electrodes 170 through the back surface field layer 150.

Accordingly, as shown in FIG. 1, when the first electrodes 140 of one solar cell 10 are connected to the second electrodes 170 of another solar cell 10 adjacent to the one solar cell 10 using the interconnectors 20, electric current flows through the solar cells 10 and allows use of the electric current for electric power.

Solar cell modules according to example embodiments of the invention are described below with reference to FIGS. 7 to 10. In the following description, structures and components identical or equivalent to those described in the first embodiment are designated with the same reference numerals, and a further description may be briefly made or may be entirely omitted.

Figure 7:
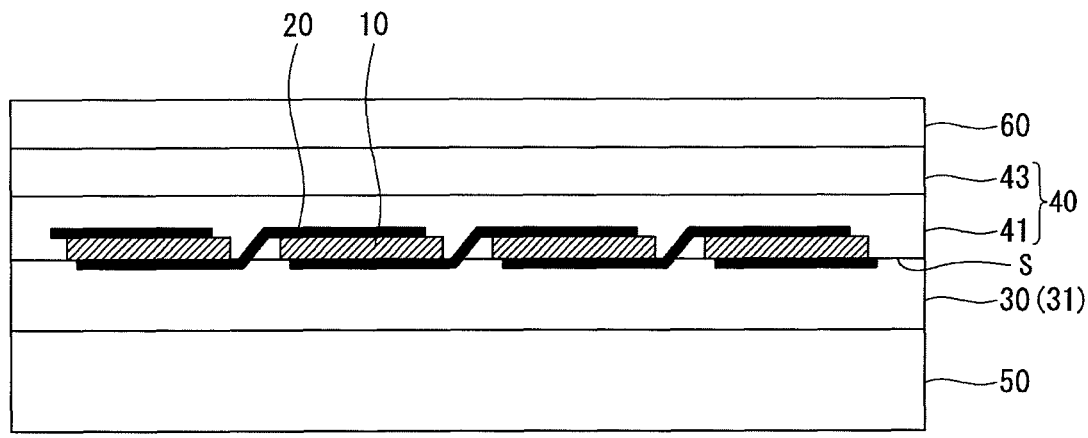
FIG. 7 is a conceptual diagram illustrating a schematic configuration of a solar cell module according to a second embodiment of the invention.
Figure 8:
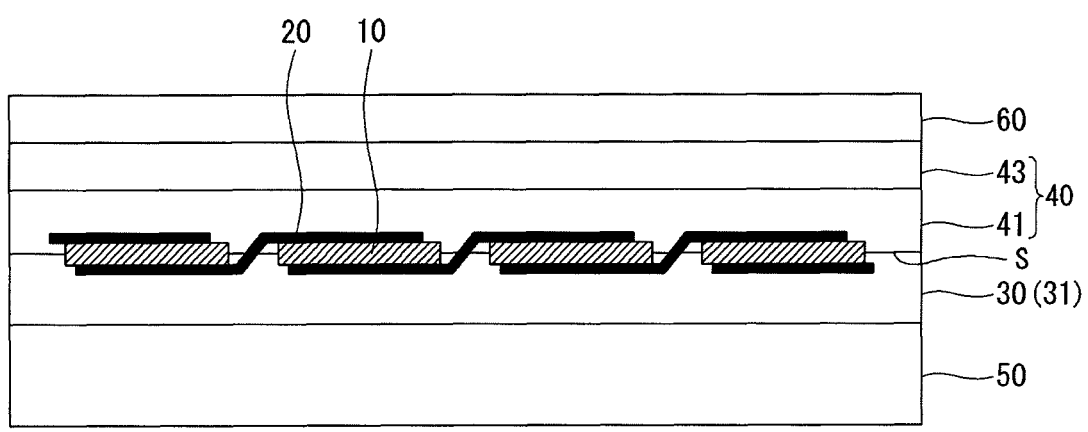
FIG. 8 is a conceptual diagram illustrating a schematic configuration of a solar cell module according to a third embodiment of the invention.

FIG. 7 is a conceptual diagram illustrating a schematic configuration of a solar cell module according to a second embodiment of the invention. FIG. 8 is a conceptual diagram illustrating a schematic configuration of a solar cell module according to a third embodiment of the invention.

Configurations described in the second and third embodiments are substantially the same as the first embodiment, except that a portion of each solar cell is buried in a first silicone resin.

FIG. 7 illustrates that an interconnector 20 positioned on a first surface of each solar cell 10 is buried in a first silicone resin 31. FIG. 8 illustrates that an interconnector 20 positioned on a first surface of each solar cell 10 and a portion of each solar cell 10 are buried in a first silicone resin 31.

As shown in FIGS. 7 and 8, when the interconnectors 20 or the interconnectors 20 and the portions of the solar cells 10 are buried in the first silicone resin 31, a location of each solar cell 10 is fixed by the first silicone resin 31. Hence, misarrangement of the solar cells 10 may be prevented or reduced in subsequent module processing.

Figure 9:
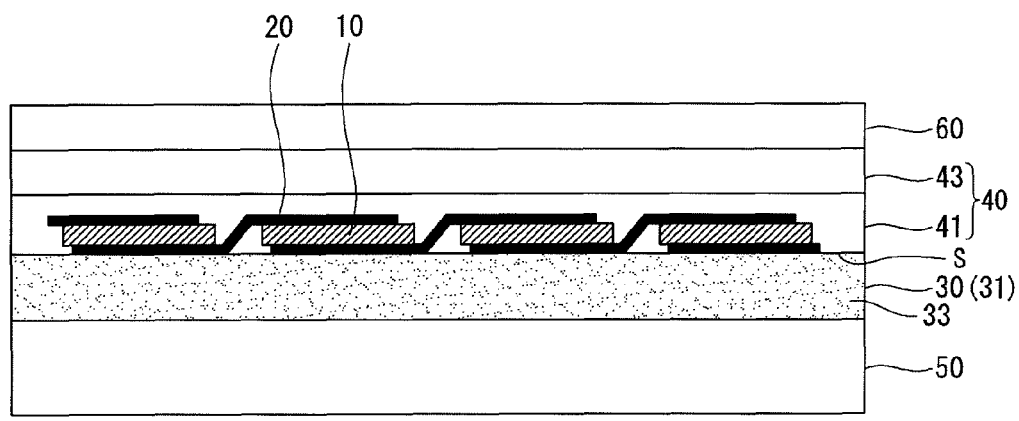
FIG. 9 is a conceptual diagram illustrating a schematic configuration of a solar cell module according to a fourth embodiment of the invention.

FIG. 9 is a conceptual diagram illustrating a schematic configuration of a solar cell module according to a fourth embodiment of the invention.

Configuration described in the fourth embodiment is substantially the same as the first embodiment, except that a first silicone resin includes a dye of a predetermined color.

A dye 33 of a first silicone resin 31 may select or provide a desired color consumers expect or desire. The first silicone resin 31 may include a fluorescent material, that emits light when light is incident on the fluorescent material, instead of the dye 33.

An appearance of the solar cell module may be improved by the first silicone resin 31 including the dye 33.

A second silicone resin 41 and/or a fiber material 43 may include the dye 33 instead of the first silicone resin 31, or all of silicone resin 41, a fiber material 43 may include the dye 33. In embodiments of the invention, the dye 33 may be of one or more colors. In such an instance, text and/or graphics may be provided by the various color dyes 33.

Figure 10:
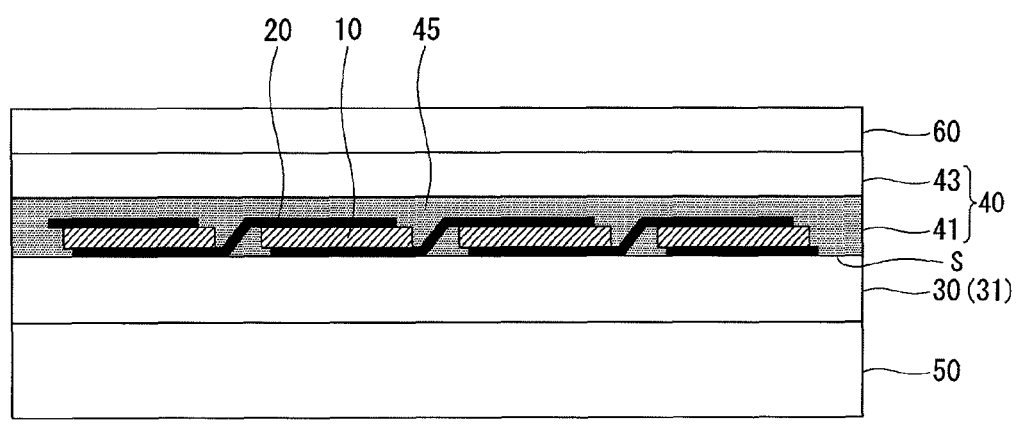
FIG. 10 is a conceptual diagram illustrating a schematic configuration of a solar cell module according to a fifth embodiment of the invention.

FIG. 10 is a conceptual diagram illustrating a schematic configuration of a solar cell module according to a fifth embodiment of the invention.

Configuration described in the fifth embodiment is substantially the same as the first embodiment, except that a second silicone resin includes an ultraviolet blocking material.

An ultraviolet blocking material 45 of a second silicone resin 41 prevents discoloration and degradation of a back substrate 60. The ultraviolet blocking material 45 may contain at least one of titanium dioxide, zinc oxide, avobenzone, oxybenzone, methyl anthranilate (meradimate), phenylbenzimidazole sulfonic acid (ensulizole), octocrylene, octyl salicylate (octisalate), octyl methoxycinnamate (octinoxate), and padimate O. In embodiments of the invention, the ultraviolet blocking material 45

A method for manufacturing the solar cell module shown in FIG. 1 is described below with reference to FIG. 11.

First, a first silicone resin 31 is coated on one surface of a front substrate 50 to a thickness of about 0.3 mm to 0.5 mm and is left for about 30 to 60 seconds to level the first silicone resin 31. In this instance, a frame of a predetermined height capable of surrounding the front substrate 50 may be installed and may prevent the coated first silicone resin 31 from overflowing outside the front substrate 50.

Subsequently, the front substrate 50, on which the liquid first silicone resin 31 is coated, is disposed in an oven and is heated at a temperature equal to or higher than about 80° C., for example, at about 90° C. to 110° C. to cure the liquid first silicone resin 31. Hence, a front protective member 30 is formed using the first silicone resin 31. When the curing processing is performed, the first silicone resin 31 is attached to the front substrate 50, and one surface of the first silicone resin 31, i.e., the surface opposite the surface of the first silicone resin 31 attached to the front substrate 50, is an uneven surface.

Next, a plurality of solar cells 10 is disposed on the front protective member 30. A second silicone resin 41 is coated to a thickness of about 0.3 mm to 0.5 mm and is left for about 30 to 60 seconds to level the second silicone resin 41. In this instance, a process for coating the liquid second silicone resin 41 may be performed using a frame in the same manner as the first silicone resin 31.

The liquid second silicone resin 41 is filled in a space between the adjacent solar cells 10 and a space between the solar cells 10 and the front protective member 30 through the process for coating and leveling the second silicone resin 41.

After the process for leveling the second silicone resin 41 is completed, a fiber material 43 is disposed on the second silicone resin 41 and a back substrate 60 is disposed on the fiber material 43.

When the fiber material 43 and the back substrate 60 are disposed on the liquid second silicone resin 41, the second silicone resin 41 is pressed because of the weight of the fiber material 43 and the back substrate 60. Hence, the second silicone resin 41 is filled in a space between individual fibers 43b of the fiber material 43. The second silicone resin 41 filled in the space between the individual fibers 43b contacts the back substrate 60.

When at least a portion of the fiber material 43 does not contact the back substrate 60, the second silicone resin 41 is filled in a space between the fiber material 43 and the back substrate 60.

An upper part of the back substrate 60 may be pressed at a uniform pressure, so that the second silicone resin 41 can be sufficiently filled in the space between the individual fibers 43b and/or the space between the fiber material 43 and the back substrate 60. In embodiments of the invention, the fiber material 43 is disposed in the back protective member 40.

Afterwards, a process for curing the second silicone resin 41 is performed. The curing process of the second silicone resin 41 may be performed by heating the second silicone resin 41 in an oven at a temperature equal to or higher than about 80° C., for example, at about 90° C. to 110° C. in the same manner as the first silicone resin 31. Alternatively, the curing process of the second silicone resin 41 may be performed using a general laminating device.

When the second silicone resin 41 is toughened (e.g., cured), the second silicone resin 41 filled in a space 43a of the fiber material 43 is attached to the back substrate 60. Further, the second silicone resin 41 filled in the space between the fiber material 43 and the back substrate 60 is attached to the back substrate 60.

The fiber material 43 of the back protective member 40 may be separated from the back substrate 60 by a predetermined distance. In other words, most of the surface of the fiber material 43, except a local area, opposite the back substrate 60 may be separated from the back substrate 60. Thus, the fiber material 43 may be positioned inside the second silicone resin 41 at a location closer to the back substrate 60 than the solar cells 10.

In this instance, a first coating process of the second silicone resin 41 may be performed, and then the fiber material 43 may be disposed. Next, a second coating process of the second silicone resin 41 may be performed.

Alternatively, the coated second silicone resin 41 going through the first coating process may be toughened (e.g., cured) in a state where the fiber material 43 is disposed, and then a second coating process of the second silicone resin 41 may be performed. Next, the coated second silicone resin 41 going through the second coating process may be toughened (e.g., cured) in a state where the back substrate 60 is disposed. In this instance, an interface between the second silicone resin 41 going through the first coating process and the second silicone resin 41 going through the second coating process may be an uneven surface.

Figure 11:
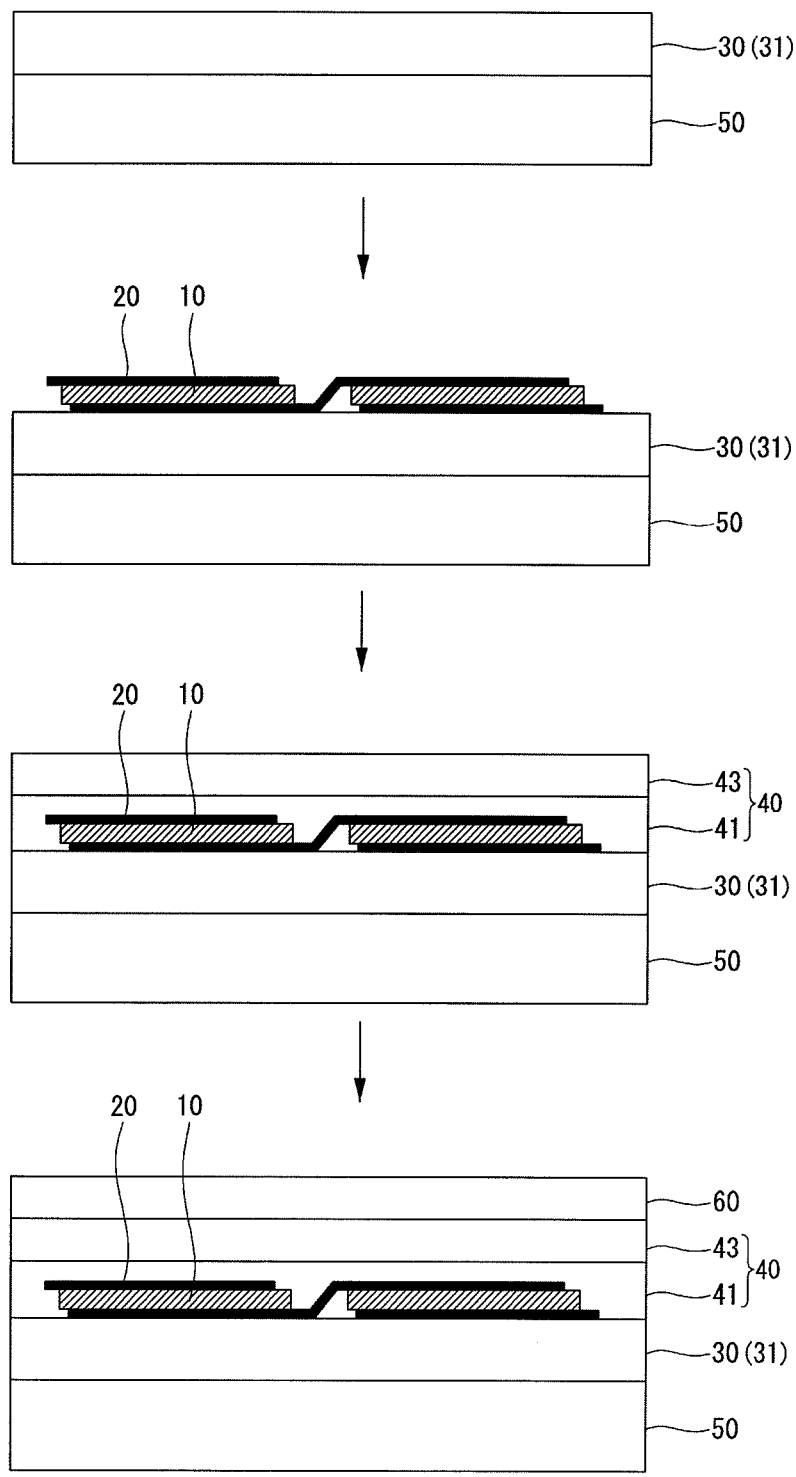
FIG. 11 illustrates a method for manufacturing a solar cell module shown in FIG. 1.

With reference to FIG. 11, the fiber material 43 may be alternatively or additionally disposed on the first silicone resin 31 or on the front substrate 50. Accordingly, the fiber material 43 may be disposed between the front substrate 50 and the solar cells.

Figure 12:
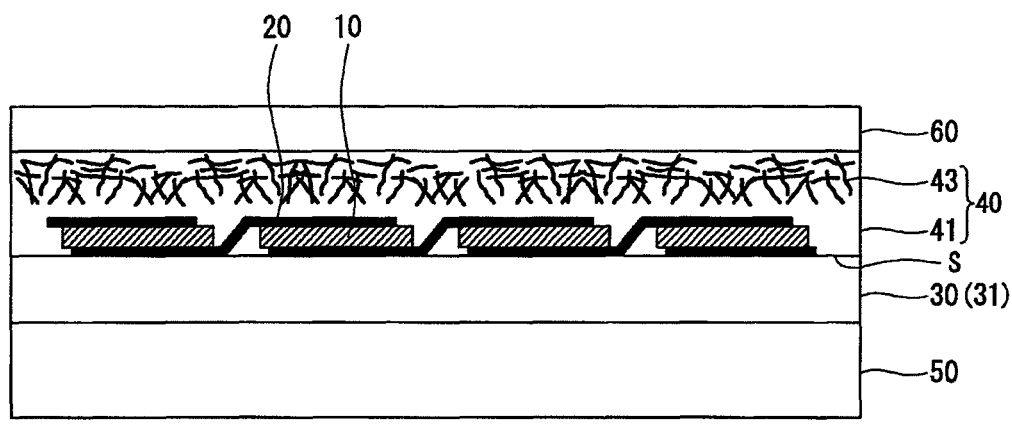
FIG. 12 is a conceptual diagram illustrating a schematic configuration of a solar cell module according to a sixth embodiment of the invention.

In other embodiments of the invention, the fiber material 43 need not be a layer disposed on the second silicone resin 41, for example. Instead, as shown in FIG. 12, which is a conceptual diagram illustrating a schematic configuration of a solar cell module according to a sixth embodiment of the invention, the fiber material 43 may be distributed throughout the back protective member 40. In other embodiments of the invention, the fiber material 43 may be alternatively or additionally distributed throughout the front protective member 30.

In embodiments of the invention, reference to the first silicone resin 31 and the second silicone resin 41 being toughened includes the concept of curing, solidifying, hardening solidifying or an increase in viscosity, for example.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a solar cell module, comprising:

forming a front protective member including a hardened first silicone resin on a first surface of a front substrate;

disposing a plurality of solar cells on the front protective member;

forming a back protective member including a hardened second silicone resin and a fiber material on the plurality of solar cells, the fiber material including individual fibers divided by a space; and disposing a back substrate on the fiber material, wherein the forming of the front protective member comprises coating a liquid first silicone resin on the first surface of the front substrate and hardening the coated liquid first silicone resin, wherein the forming of the back protective member comprises coating a liquid second silicone resin on the plurality of solar cells, disposing the fiber material on the coated second silicone resin, and hardening the coated second silicone resin, and wherein a thickness of the fiber material including the individual fibers is less than a thickness of the hardened second silicone resin, and the fiber material is positioned closer to the back substrate than the plurality of solar cells.

2. The method of claim 1, wherein the liquid first silicone resin is coated on the first surface of the front substrate to a thickness of about 0.3 mm to 0.5 mm.

3. The method of claim 1, wherein the coated liquid first silicone resin is left for about 30 to 60 seconds to level the liquid first silicone resin.

4. The method of claim 1, wherein the hardening of the coated liquid first silicone resin comprises disposing the first substrate, on which the liquid first silicone resin is coated, in an oven and curing the coated liquid first silicone resin at a temperature equal to or higher than about 80° C.

5. The method of claim 4, wherein, when the curing processing is performed, the coated liquid first silicone resin is attached to the first surface of the front substrate, and a surface opposite the surface of the cured first silicone resin attached to the first surface of the substrate has an uneven surface.

6. The method of claim 1, wherein the hardening of the coated first silicone resin comprises disposing the first substrate, on which the liquid first silicone resin is coated, in an oven and curing the coated liquid first silicone resin at a temperature about 90° C. to 110° C.

7. The method of claim 6, when the curing processing is performed, the coated liquid first silicone resin is attached to the first surface of the front substrate, and a surface opposite the surface of the cured first silicone resin attached to the first surface of the substrate has an uneven surface.

8. The method of claim 1,
wherein the hardening of the coated second silicone resin is performed after the disposing of the back substrate on the fiber material.

9. The method of claim 8, wherein the liquid second silicone resin is coated on the plurality of solar cells to a thickness of about 0.3 mm to 0.5 mm.

10. The method of claim 8, wherein the coated liquid second silicone resin is left for about 30 to 60 seconds to level the liquid second silicone resin.

11. The method of claim 10, wherein, when the leveling process is performed, the liquid second silicone resin is filled in a space between the adjacent solar cells and a space between the solar cells and the front protective member.

12. The method of claim 8, wherein, when the fiber material and the back substrate are disposed on the coated liquid second silicone resin, the coated liquid second silicone resin is filled in the space between the individual fibers of the fiber material, and the coated liquid second silicone resin filled in the space between the individual fibers contacts the back substrate.

13. The method of claim 8, wherein the hardening of the coated liquid second silicone resin comprises disposing the first substrate, on which the fiber material and the back substrate are disposed, in an oven and curing the coated liquid second silicone resin at a temperature equal to or higher than about 80° C.

14. The method of claim 13, when the curing processing is performed, the coated liquid second silicone resin is attached to the first protective member, the plurality of solar cells, and the back substrate.

15. The method of claim 8, wherein the hardening of the coated liquid second silicone resin comprises disposing the first substrate, on which the fiber material and the back substrate are disposed, in an oven and curing the coated liquid second silicone resin at a temperature between 90° C. and 110° C.

16. The method of claim 15, when the curing processing is performed, the coated liquid second silicone resin is attached to the first protective member, the plurality of solar cells, and the back substrate.

\* \* \* \* \*